(12) United States Patent
Shinde et al.

(10) Patent No.: US 9,190,392 B1
(45) Date of Patent: Nov. 17, 2015

(54) THREE-DIMENSIONAL STACKED STRUCTURED ASIC DEVICES AND METHODS OF FABRICATION THEREOF

(71) Applicant: Sandia Corporation, Albuquerque, NM (US)

(72) Inventors: Subhash L. Shinde, Albuquerque, NM (US); John Teifel, Albuquerque, NM (US); Richard S. Flores, Albuquerque, NM (US); Robert L. Jarecki, Jr., Albuquerque, NM (US); Todd Bauer, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/283,101

(22) Filed: May 20, 2014

Related U.S. Application Data

(60) Provisional application No. 61/825,385, filed on May 20, 2013.

(51) Int. Cl.
  *H01L 23/48* (2006.01)
  *H01L 25/065* (2006.01)
  *H01L 23/538* (2006.01)
  *H01L 23/00* (2006.01)
  *H01L 27/02* (2006.01)
  *H01L 27/06* (2006.01)

(52) U.S. Cl.
  CPC ........ *H01L 25/0657* (2013.01); *H01L 23/5384* (2013.01); *H01L 24/89* (2013.01); *H01L 27/0207* (2013.01); *H01L 27/0688* (2013.01); *H01L 2225/06541* (2013.01)

(58) Field of Classification Search
  CPC .................. H01L 27/0207; H01L 27/0688
  See application file for complete search history.

(56) References Cited

U.S. PATENT DOCUMENTS

| | | | | |
|---|---|---|---|---|
| 6,423,558 B1 * | 7/2002 | Maeda et al. | | 438/17 |
| 7,047,514 B2 * | 5/2006 | Mizuno et al. | | 716/128 |
| 2004/0145033 A1 * | 7/2004 | McElvain | | 257/659 |

OTHER PUBLICATIONS

Banijamali et al., "Outstanding and innovative reliability study of 3D TSV interposer and fine pitch solder micro-bumps," in Proc. IEEE Electronic Components and Technology Conference (ECTC), May 2012, pp. 309-314.
Campbell D.V., "Yield modeling of 3Dintegrated wafer scale assemblies," in Proc. IEEE Electronic Components and Technology Conference (ECTC), May 2010, pp. 1935-1938.
Dong, X. et al., "Fabrication Cost Analysis and Cost-Aware Design Space Exploration for 3-D ICs," IEEE Trans, CAD, vol. 29, No. 12, Dec. 2010, pp. 1959-1972.
Kim, D.H. et al., "3D-MAPS: 3D Massively parallel processor with stacked memory," in Proc. IEEE International Solid-State Circuits Conference (ISSCCC), Feb. 2012, pp. 188-190.
(Continued)

*Primary Examiner* — John C Ingham
(74) *Attorney, Agent, or Firm* — Martin I. Finston

(57) ABSTRACT

A 3D stacked sASIC is provided that includes a plurality of 2D reconfigurable structured structured ASIC (sASIC) levels interconnected through hard-wired arrays of 3D vias. The 2D sASIC levels may contain logic, memory, analog functions, and device input/output pad circuitry. During fabrication, these 2D sASIC levels are stacked on top of each other and fused together with 3D metal vias. Such 3D vias may be fabricated as through-silicon vias (TSVs). They may connect to the back-side of the 2D sASIC level, or they may be connected to top metal pads on the front-side of the 2D sASIC level.

18 Claims, 7 Drawing Sheets

(56) References Cited

OTHER PUBLICATIONS

Mercier, P. et al., "Yield and Cost Modeling for 3D Chip Stack Technologies," in Proc. IEEE 2006 Custom Integrated Circuits Conference, Sep. 2006, pp. 357-360.

Patti, R. "Three-dimensional integrated circuits and the future of system-on-the-chip designs," Jun. 2006, Proc. IEEE, vol. 94, No. 6, pp. 1214-1224.

Suarez, et al., "A CMOS-3D reconfigurable architecture with in-pixel processing for feature detectors," in Proc. IEEE International 3D Systems Integration Conference (3DIC), Jan. 2012, pp. 1-8.

Thorolfsson et al., "Design Automation for a 3DIC FFT Processor for Synthetic Aperture Radar: A Case Study," in Proc. ACM Design Automation Conf. (DAC), Jul. 2009, pp. 51-56.

Velenis, D. et al., "Cost effectiveness of 3D integration options," in Proc. IEEE International 3D Systems Integration Conf. (3DIC), Nov. 2010, pp. 1-6.

Wu, K.C. et al., "Structured ASIC, Evolution or Revolution?," in Proc. ACM International Symp. on Physical Design (ISPD), Apr. 2004, pp. 103-106.

Zhang, T. et al., "A customized design of DRAM controller for on-chip 3D DRAM stacking," in Proc. IEEE Custom Integrated Circuits Conference (CICC), Sep. 2010, pp. 1-4.

\* cited by examiner

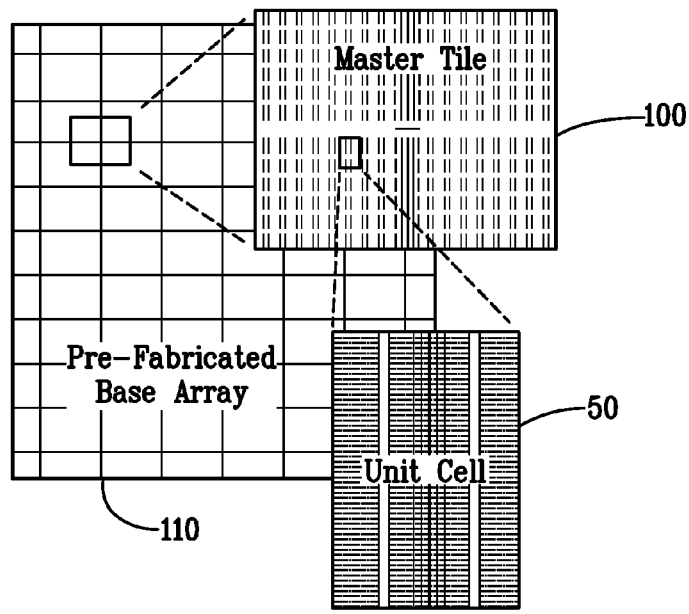
FIG. 2
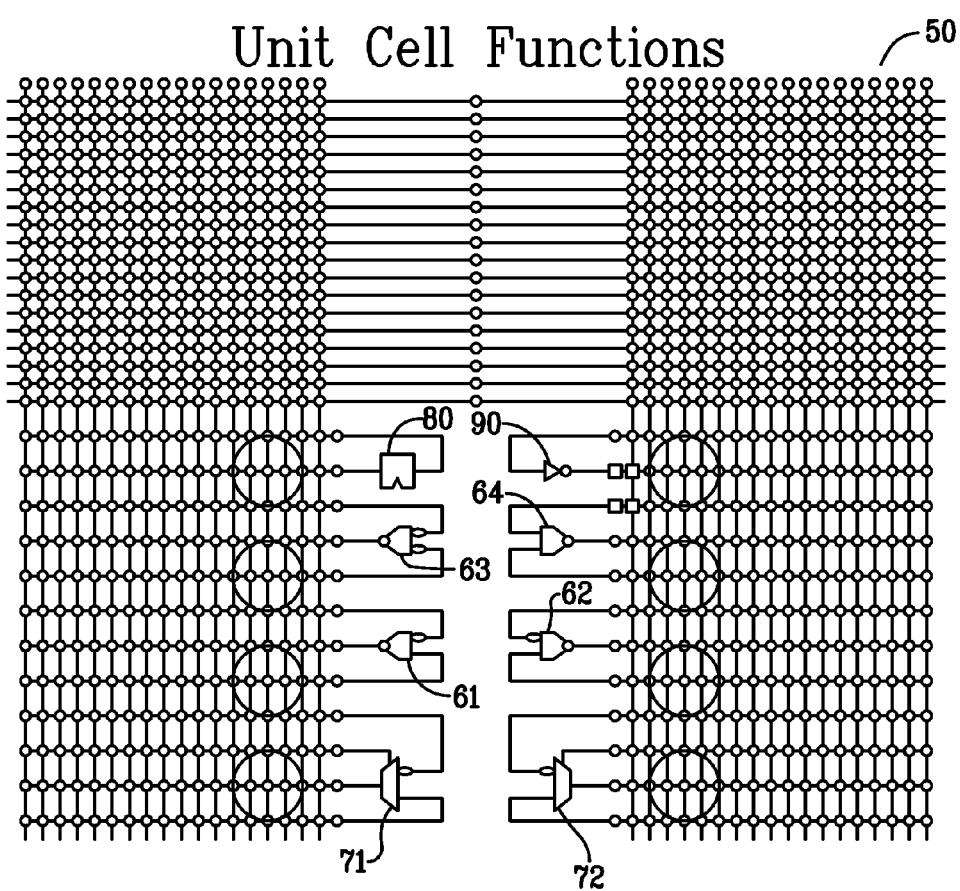

THREE-DIMENSIONAL STACKED STRUCTURED ASIC DEVICES AND METHODS OF FABRICATION THEREOF

CROSS-REFERENCE TO RELATED APPLICATION

This non-provisional application claims the benefit of the earlier filing date of U.S. Provisional Application No. 61/825,385, filed May 20, 2013.

STATEMENT OF GOVERNMENT INTEREST

This invention was developed under Contract DE-AC04-94AL85000 between Sandia Corporation and the U.S. Department of Energy. The U.S. Government has certain rights in this invention.

FIELD OF THE INVENTION

The invention relates to three-dimensional integrated circuit platforms.

ART BACKGROUND

Due to continuing improvements in fabrication processes and design tools, and to demands for ever greater functionality in packages of limited volume, it has become commonplace to design and market application-specific integrated circuits (hereafter, "ASICs") of great complexity, including tens of millions of gates, or even more. In view of such demands, it has become attractive to consider three-dimensional (hereafter, "3D") fabrication techniques, because such techniques have a known potential to improve performance and reduce power consumption, as well as to reduce package size.

Indeed, it is possible with 3D technology to partition functions on different levels, enabling a smaller area die with much higher yield to be fabricated separately and stacked at wafer level. 3D technology also enables heterogeneous integration of different device technologies (e.g., digital, analog, RF, MEMS, and photonics), and may allow the use of less costly fabrication processes due to increased logic densities in the overall stack. However, one possible drawback is that, depending on the 2D technology chosen for individual layers and the 3D assembly processes employed, 3D integration could increase the total device fabrication duration and costs.

The costs of fabricating highly complex ASICs and other integrated circuits have in fact driven a further trend toward designing IC platforms that include both standardized building blocks and programmable logic and interconnects. A field-programmable gate array (FPGA), for example, reduces non-recurring engineering (NRE) costs because at least some of its application-specific functionality is programmed by the user.

Another approach is the structured ASIC (hereafter, "sASIC"). The sASIC concept resembles the FPGA concept in that it employs a regular fabric-like circuit architecture in pre-qualified base array platforms to accelerate turn-around times and reduce NRE costs and development risk.

The fabrication sequence for a sASIC uses a one-time metal-via mask to configure user function into the base array. As with an FPGA, the sASIC base array can be pre-fabricated before customization and re-used across multiple design implementations, and it can be produced in significantly shorter time and at a much lower cost than a custom ASIC.

The sASIC provides some advantage over FPGAs because it is generally more competitive to custom ASICs in speed, power, and circuit densities.

As the above-described trends converge, there is a growing need for new approaches to 3D integration that offer the cost reductions and other advantages of standardized base arrays combined with programmable building blocks.

SUMMARY OF THE INVENTION

We have invented a 3D stacked sASIC that includes a plurality of 2D reconfigurable structured sASIC levels interconnected through hard-wired arrays of 3D vias. The 2D sASIC levels may contain logic, memory, analog functions, and device input/output pad circuitry. During fabrication, these 2D sASIC levels are stacked on top of each other and fused together with 3D metal vias. Such 3D vias may be fabricated as through-silicon vias (TSVs). They may connect to the back-side of the 2D sASIC level, or they may be connected to top metal pads on the front-side of the 2D sASIC level.

We believe that TSVs can be made with low parasitic effects, and hence can be implemented at relatively high density. In turn, a large number of TSVs with low parasitics facilitates the integration of silicon photonics with sASIC stacks having multiple channels with Si photonics. Through such an approach, there can be provided a cluster of sASIC stacks connected through low-energy, high-speed, high-bandwidth photonic links.

We believe in particular that combining sASICs with TSVs and 3D stacked assembly processes in accordance with the invention can lead to a device that is greater in density than a custom ASIC and highly reconfigurable, but that is still faster and more economical to fabricate.

According to a first aspect, our invention is embodied in an integrated circuit (IC) assembly that includes two or more structured ASIC (sASIC) dies. Each of these sASIC dies contains a plurality of metallization layers and a plurality of via layers that interconnect respective pairs of adjacent metallization layers. The sASIC dies are vertically arranged and interconnected by hard-wired vertical vias to form a three dimensional (3D) stack. A 3D, application-specific interconnection pattern is defined in the 3D stack. Some or all of the sASIC dies each include one special via layer that bears a mask-programmed pattern of vias. The mask-programmed via patterns of all of the special via layers collectively define all mask-programmable routing for the 3D application-specific interconnection pattern.

BRIEF DESCRIPTION OF THE DRAWINGS

FIG. 2 provides a schematic view of sASICs using repetitive tiles, referred to here as master tiles, to create generic via-configurable logic fabrics.

DETAILED DESCRIPTION

We will describe an exemplary embodiment that we have implemented in silicon using SOI (Silicon-on-Insulator) CMOS processes. The exemplary embodiment is a 3D-stackable 12 mm×12 mm structured ASIC die that has 42K interconnects and that is resource compatible with existing 2D structured ASIC devices of the same size. The exemplary 3D structured ASIC platform was designed and fabricated in our 0.35-µm foundry. It includes high-density front-end-of-line through silicon vias (TSVs) that we developed to implement the 3D vertical interconnects, as explained below.

Figure 1:
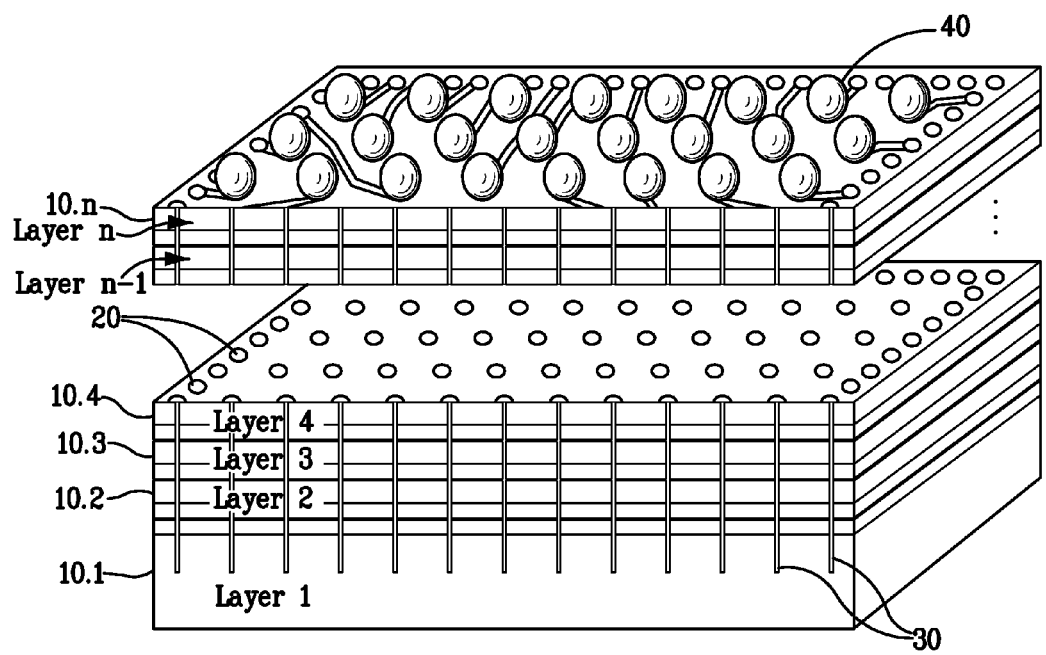
FIG. 1 provides a conceptual view of an exemplary 3D sASIC platform.

A simplified drawing of such a 3D vertical stack is provided in FIG. 1, where each of layers 10.1-10.$n$ is a two-dimensional die connected to the neighbors above and below it by way of a fixed pattern of 3D interconnects 20. The three-dimensional interconnections are facilitated by an array of through-silicon vias (TSVs) 30. A ball-grid array 40, to which the input and output contacts have been redistributed, is shown at the top of the stack.

The basic building block of the 3D stack in our platform consists of a 2D structured ASIC die that uses a one-time metal-via mask to configure user designs into the silicon. Since each 2D structured ASIC die can be partially pre-fabricated before the configuration via layer, the die can be produced in significantly shorter time and at a lower cost than custom ASIC die. After each 2D structured ASIC die completes final fabrication, it is assembled into a vertical stack and is thereby incorporated in a 3D structured ASIC.

The number of 3D interconnects between the stacked dies is fixed, and the respective locations of the 3D interconnects are also fixed. The respective levels in the 3D structured ASIC implementation collectively determine how the 3D interconnects are used, as will be explained below. In addition, custom die such as memories or analog units can be included in the 3D structured ASIC stack if they adhere to the standardized 3D interconnect pattern.

To extend an existing 2D structured ASIC device architecture to the 3D domain, 42K vertical interconnect pads were added to the die to facilitate 3D communication and power delivery. Compromises in the number of 3D interconnects were made to preserve the die size and transistor count of the 2D device. We were able to design the resulting 3D structured ASIC platform so that it would support typical 3D assembly techniques, including face-to-face and face-to-back stacking using TSVs.

The 2D structured ASIC that is the basis for our 3D design belongs to the ViArray family of structured ASIC base arrays that Sandia National Laboratories developed for its internal 350-nm radiation hardened silicon-on-insulator (SOI) foundry. The ViArray logic fabric is based on ViASIC® Via-Mask™ technology as described, e.g., in "ViaMask Data Sheet: Standard Metal Library for Configurable SOCs and Structured ASICs," available from the viasic.com website, the entirety of which is hereby incorporated herein by reference.

FIG. 2 provides an overview of the basic design technology. Turning to the figure, it will be seen that the unit cell 50 consists of four NAND gates 61-64, two MUX gates 71-72, a resettable DFF 80, and various inverter cells 90. All logic functions in a design are implemented with these basic gates. The unit cell is arrayed and overlaid with metal routing tracks to create a master tile 100, which contains the equivalent of 3K logic gates. In addition, the master tile contains high-drive buffers and 4K bits of dual-ported SRAM interspersed between the unit cells.

To create a structured ASIC platform, the master tile is replicated, and the resulting base array 110 is connected to an I/O pad frame and other pre-built mixed-signal IP blocks. (By "IP" is meant "intellectual property", i.e., physically embodied aspects of circuit design that typically include proprietary design information.)

The ViArray structured ASIC platforms that we describe here were designed for the Sandia National Laboratories CMOS7 foundry technology, which is a strategically radiation-hardened, 3.3-Volt, 0.35-µm, SOI (Silicon-on-Insulator) CMOS process for custom, high-reliability digital, analog, and mixed-signal ASICs. It is a 150-mm wafer foundry. CMOS7 is a 24-mask-level process with 5 metal layers.

Figure 3:
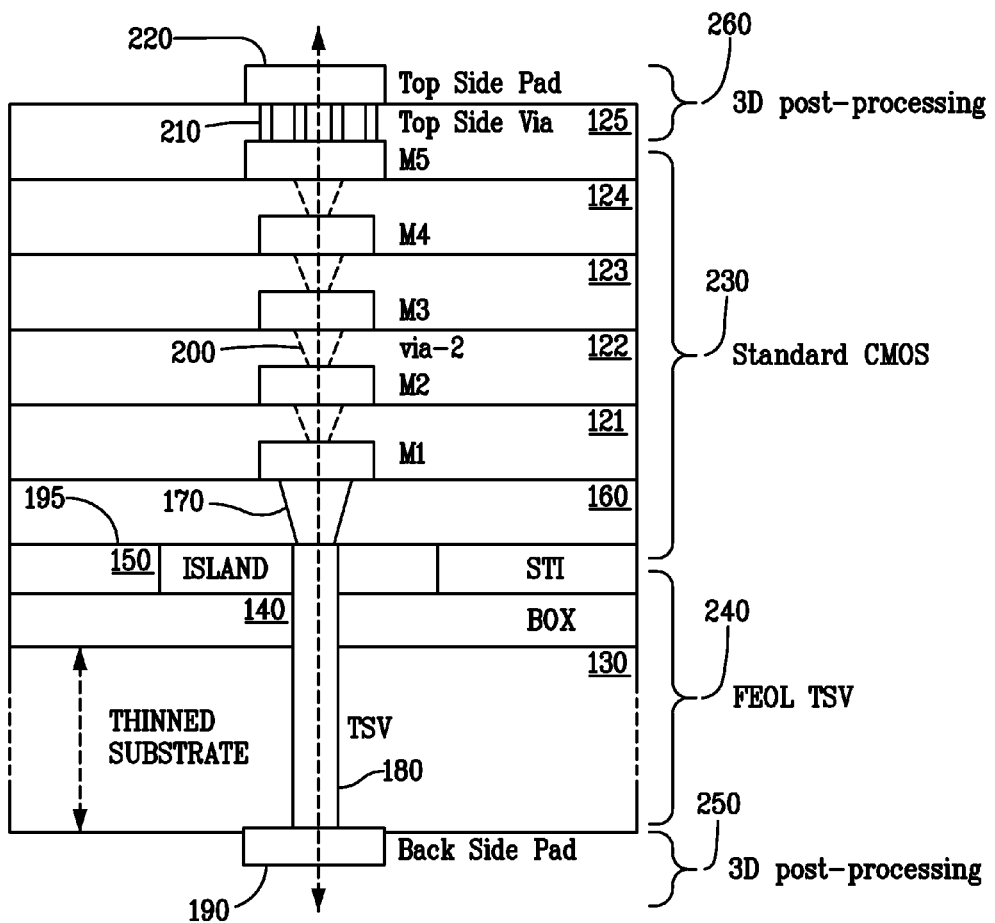
FIG. 3 provides a schematic diagram of our 0.35-μm process with 3D extensions.

The foundry cross section is illustrated in FIG. 3. The five metal layers of our process are indicated in the figure as metal-1 layer 121, metal-2 layer 122, metal-3 layer 123, metal-4 layer 124, and metal-5 layer 125. The metal layers overlie an SOI wafer that includes a thinned silicon substrate layer 130 and a buried oxide (BOX) layer 140. The device layer includes 270-nm top silicon layer 150, overlain by interlayer dielectric (ILD) layer 160. A tungsten plug 170 is shown connecting the metal-1 layer to a through-silicon via (TSV) 180, which extends through the substrate to a back-side contact pad 190. As seen in the figure, a shallow trench isolation (STI) region 195 is formed around the island in the top silicon layer that is penetrated by the TSV.

Adjacent metal layers are interconnected by vias. In particular, the via-2 layer 200 connects metal-2 to metal-3, and a layer 210 of top-side vias connects metal-5 to the top-side pads such as pad 220.

The section indicated in the figure by reference numeral 230 is fabricated by standard 2D CMOS processing. This section includes metal-1 to metal-5 and conventional aspects of the device layer. The section indicated by reference numeral 240 is where the through-silicon vias for 3D interconnection are made by our front-end-of-line (FEOL) TSV process, which will be described in detail below. This section includes the device layer and substrate. Reference numerals 250 and 260 indicate regions, respectively including back-side pad 190 and top-side pad 220, that are fabricated in our post-processing step for 3D interconnections.

The 24 mask levels referred to above are required for the standard 2D processing. Four additional masks are required for the 3D-specific layers. Those layers include the TSV definition, the back-side TSV bond pads, the top-side bond pads, and the vias between the top metal layer (metal-5) and the top-side bond pad.

The configuration of a user design onto a ViArray device occurs at the via-2 layer, i.e. between metal-2 and metal-3. The via-2 mask connects power and ground conductors to the appropriate unit cells, configures the logic gates inside the unit cell for their respective desired functions, and configures the routing tracks to connect the logic gates together. Via-2 connections are also used to configure the I/O pads and other IP blocks.

As will be seen below, the via-2 mask is also used to define the mask-programmable routing for our new 3D structured ASIC.

An example ViArray platform is the design that bears our designation 6M-2D. This platform uses a 12 mm×12 mm die and has 6M transistors. The platform is partitioned into four power-domain quadrants. These power domains allow the user to separate designs onto different power supplies, implement redundancy, or apply power sequencing schemes. The power domains can be merged together in any combination, including defining them as a single global power domain. Weak pull-down transistors are available in the logic fabric to prevent unpowered inputs from floating.

A modified die intended specifically for 3D applications bears our designation 6M-3D. It was based on the 6M-2D design but was modified to include a fixed vertical interconnect consisting of 21K pads on both its top and back faces for signal and power delivery between different levels of the stack. We have envisaged 3D designs, designated 12M-3D and 18M-3D, that are respectively 2-level and 3-level 3D stacked structured ASICs based on the 6M-3D die. It will be understood that further variations based on, e.g., the 6M-3D die are feasible. For example, memory or analog levels could be added. Further possibilities include a 3D stacked structure of two, three, or more levels based on a 20×20-mm chip with 18M transistors.

The 6M-3D die is the basis for the exemplary embodiment described below.

High-density, front-end-of-line TSVs 180 were developed at our facility to support the implementation of 3D structured ASICs. Tungsten was used for the TSV metal material. Copper would be a possible alternative material, but our foundry did not support copper processing. The TSVs were nominally 2 μm in diameter and 40 μm deep, and they were isolated from the silicon substrate by an $SiO_2$ insulator layer surrounding the circumference of the TSV along its entire length. TSV pitches as small as 20 μm have been implemented. The TSV resistance is minimal and is not expected to significantly limit the electrical performance of the 3D structured ASIC platform.

With further reference to FIG. 3, the bond pads for 3D interconnection include the back-side bond pads 190 and the top-side bond pads 220. Each of the top-side pads is aligned with a corresponding back-side pad. The top-side pads are connected through the top-side vias 210 to the metal-5 layer. Each of the top-side pads is underlain and connected to sixteen top-side bond pads arranged in a 4×4 grid. We refer to these as "3D vias" because they are used to distribute I/O and power up and down to the different levels of the stack.

The via-2 mask is the only mask that is changed or customized to implement an application design. All other mask layers are fixed and are not regenerated. Because of this feature, the structured ASIC wafers can be prefabricated up to via-2 and stockpiled until the application designs are completed. Once an application design commits a via-2 mask, the remaining metal layers are fabricated, and for 3D devices the 3D bond pad layers are fabricated as well.

The following constraints were imposed on the 6M-3D structured ASIC die design:

(1) the 3D interconnects were laid out with mirror symmetry about the Y-axis, i.e. about one of the horizontal axes, so that using the same mask on the front as on the back would result in the pairing and alignment of the back-side TSV pads with the top-side pads. This feature is desirable because it supports both face-to-face and face-to-back 3D assembly.

(2) The 3D bond pads were sized at 10 μm×10 μm. This conservative design rule is desirable because it supports a wide range of 3D assembly options. Such options include wafer-to-wafer assembly, die-to-wafer assembly, and die-to-die assembly as alternative assembly techniques. Such options also include the use of alternative assembly materials, methods of material preparation, and bonding tools. Our relatively large 3D bond pads are able to accommodate substantial variation in alignment tolerances among vendors and among the various alternative bonding technologies.

(3) The die size (12 mm×12 mm) was kept the same as the 6M-2D design to retain similar 2D yield and package I/O resources. By "package I/O resources" is meant the I/O pads for use in, e.g., wire bonded or flip chip assembled integrated circuit packages. The number of package I/O pads is proportional to the footprint area of the 2D die or 3D stack. Those skilled in the art will understand that this constraint is less important when the 3D stacks are assembled directly onto a silicon wafer, rather than assembled by the traditional techniques mentioned above. We also assumed that the 3D structured ASIC would use the same via-configurable logic fabric as the existing 2D structured ASICs.

The master tile, shown as element 100 of FIG. 2, is the main cell used to lay out a structured ASIC device. Our exemplary master tile is based on Triad Semiconductor's VCA™ technology. It consists of 3K logic gates and 4K bits of dual-ported SRAM. The transistors in the master tile are overlaid with fixed metal layers that are used for signal routing and power distribution. As noted above, to create a structured ASIC device the master tile is duplicated in a rectangular array and connected to an I/O pad frame and possibly other pre-built custom IP blocks.

For a given application-specific design, custom via-2 mask layers are generated with the aid of auto-place-and-route tools to configure the required logic and routing resources.

As noted above, the via-2 mask layers are also used in the respective levels of our 3D stack to collectively define the application-specific three-dimensional interconnection pattern. Extensions of the 2D mask-generation techniques to three dimensions are known in the art and need not be described here.

Since the layout efficiency of the master tile directly impacts its competitiveness against standard-cell custom ASIC designs, it has been heavily optimized across several structured ASIC device generations. As a result of these optimizations, the master tile layout is very dense through all of the process layers and in general is difficult to modify without increasing its area or decreasing its functionality.

As a consequence, adding 3D interconnects to the master-tile layout cell will as a practical matter add overhead by increasing the total area, or else it will demand tradeoffs in functionality. The master-tile layout cell in our current example has an area of approximately one square millimeter. The 3D interconnects in our current example contain no active devices. They are bare metal wires that connect to the master-tile routing grid.

Figure 4:
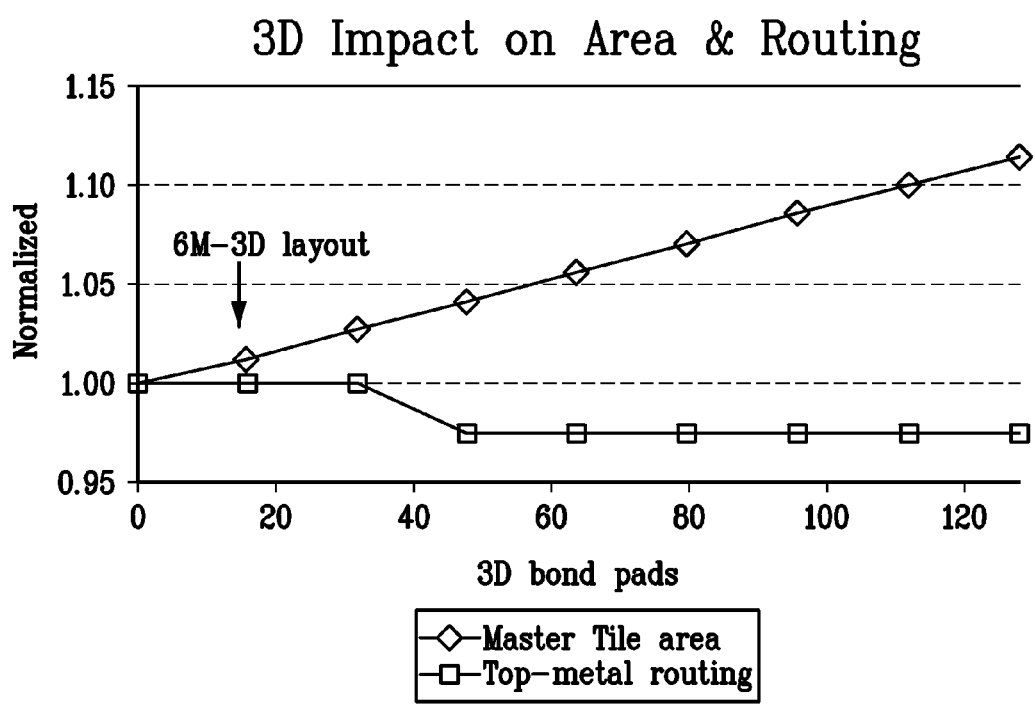
FIG. 4 presents graphical results of our numerical modeling to predict the impact of adding 3D interconnects to a master-tile layout cell according to an embodiment of the invention. The upper curve in the figure represents the impact on the master-tile area, and the lower curve represents the impact on the total number of top-metal routing tracks.

We modeled the impact of adding 3D interconnects to the master-tile layout cell. The results are shown in FIG. 4, in which the upper curve represents the impact on the master-tile area, and the lower curve represents the impact on the total number of top-metal routing tracks.

As seen in the figure, there is a 1.2% increase in master-tile area for adding the first sixteen back-side/top-side 3D bond pad pairs and a 1.5% area increase for each subsequent group of sixteen pairs.

As further seen in the figure, adding the first 32 3D bond pads to the layout necessitates removal of 2.5% of the top metal layer signal-routing tracks to create space for additional 3D bond pads. Such an outcome is undesirable because it can decrease the routability of application designs.

Alternative arrangements of the 3D bond pads in the master tile layout can maintain the signal-routing tracks at the cost of higher area overhead. For example, 128 bond pads can be added without a penalty to the signal-routing tracks, but at the cost of a 16% area increase.

Because the logic density of the master tile will decreases as the density of its 3D interconnects rises, it is advisable to consider the application-domain requirements of the structured ASIC platform before selecting the number of 3D interconnects.

Our 6M-3D structured ASIC was targeted for coarse-grain 3D applications in which the number of 3D interconnects is relatively low and the primary 3D product drivers are size and power reduction. With those considerations in mind, we added only 16 3D bond pads to the master tile. This would allow the master tile to retain all of the logic resources of the original 6M-2D structured ASIC device. The slight 1.2% increase in the master tile area was absorbed by spare area existing around the I/O pad frame. Consequently it did not cause the overall die size to increase. On the other hand, adding more than 16 3D interconnects to the master tile would have caused the die size to increase.

Figure 5:
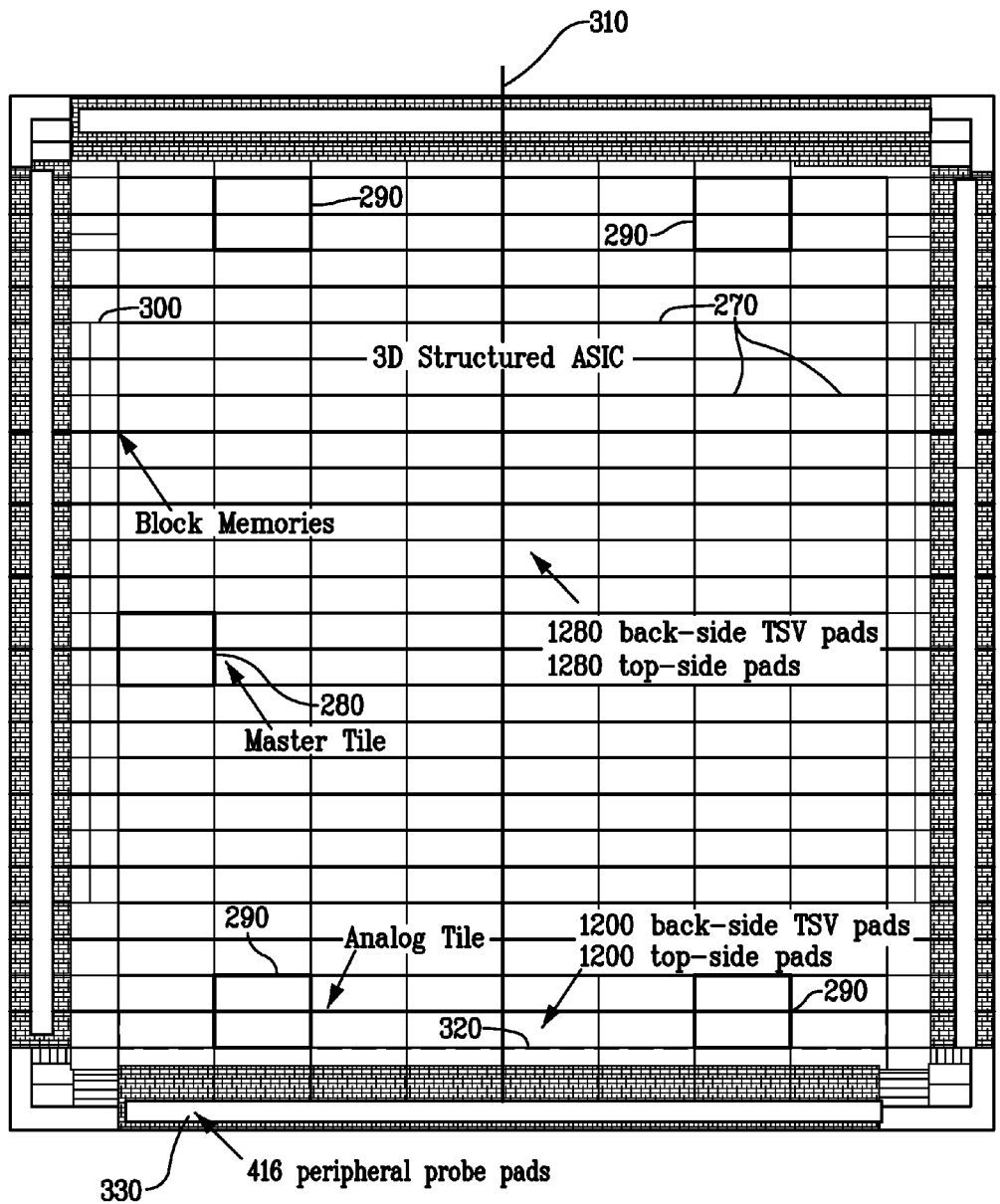
FIG. 5 provides a schematic plan view of a 6M-3D sASIC with layout modifications to support face-to-face and face-to-back 3D assembly.

FIG. 5 provides a top-down plan view of the 2D die at one level of the 6M-3D structured ASIC. As seen in the figure, there is provided a rectangular array of tiles 270, for example an array that is twelve tiles high and eight tiles across. Most of the tiles, i.e. 92 of the 96 tiles, are master tiles, e.g. tile 280. The remaining four tiles 290 are analog tiles, each of which includes an oscillator, a phase-locked loop, and a power on reset module (PSM). Along the left and right (in the figure view) edges of the tile array are arrays 300 that include block memories and possibly other components.

Generally, each master tile has sixteen 3D interconnects (not shown in the figure), each having a top-side and a back-side bond pad. The back-side pads connect to TSVs. It is not necessary for the front-side pads to connect to TSVs because they connect to the top-most metal layer. The 3D interconnects for the master tiles are placed between the master tiles, and not directly within them. Because of allowances for the partition into four power-domain quadrants, 3D interconnects are omitted from a central portion of the die. In total, therefore, there are 1280 3D-interconnect bond pads on each side of the die. The arrangement of 3D-interconnect bond pads is symmetrical about Y-axis 310.

In addition to the 2560 total master tile 3D interconnects, we added 2400 3D interconnect TSV bond pads 320 around the edge of the die, between the master tile core and the peripheral I/O pads (described below). The edge-located interconnect bond pads were arranged in pairs, with 1200 pads on the back side and 1200 matching pads on the top side of the die.

The master-tile 3D interconnect pads and the edge-located 3D interconnect pads are intended for signal transmission between die levels in the 3D stack; they are not intended for power delivery or off-package communication. Also, because they are small in size and large in number, we found it advantageous to omit ESD protection circuits for these interconnect pads, and to omit design features that would otherwise make them testable prior to 3D assembly.

With further reference to FIG. 5, we arrayed 416 probe pads 330 in the peripheral I/O pad frame. Of those probe pads, 272 were for signal routing and 144 were for power, i.e. for $v_{dd}$ and $v_{ss}$ supplies. (The 272 probe pads for signal routing are identified in FIG. 6, below, as the "I/O pads" 350.) The peripheral I/O pad frame was modified to be symmetric about the Y-axis to support both face-to-face and face-to-back 3D assembly.

Figure 6:
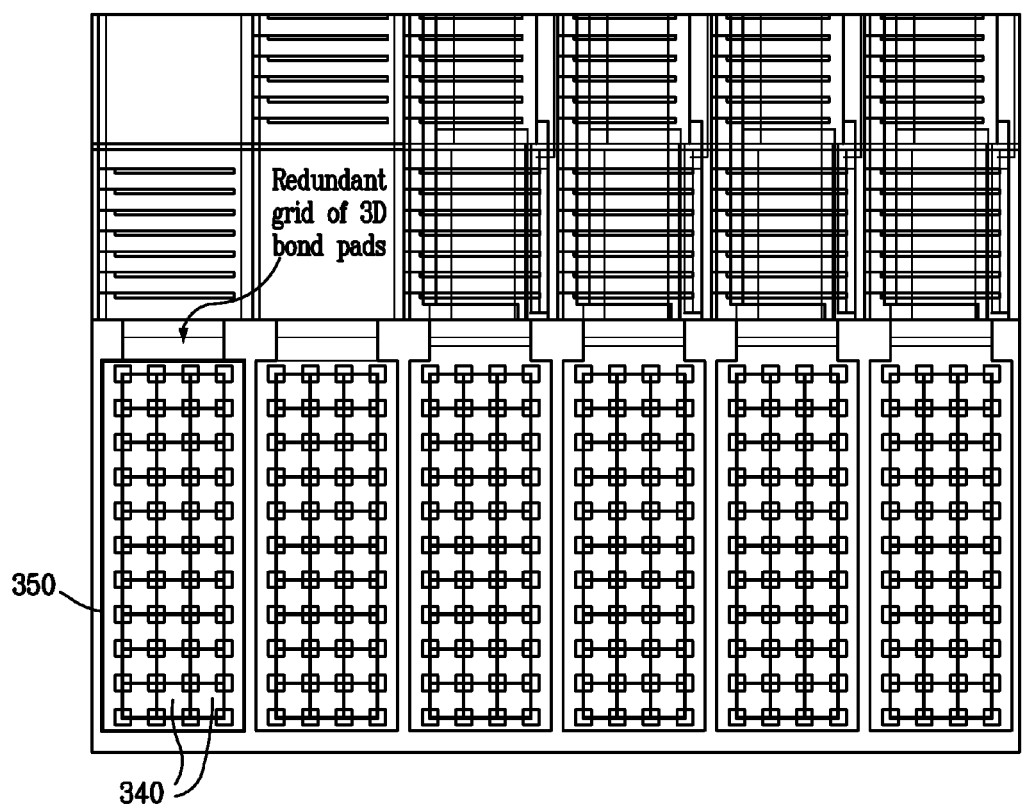
FIG. 6 provides a detail of a plan view of an exemplary 3D sASIC, showing peripheral I/O probe pads on 95-µm pitch, each containing a 4-by-11 grid of redundant back-side and top-side 3D bond pads on a 20-µm pitch.

As best seen in FIG. 6, we inserted a 4×11 grid of redundant 3D bond pads 340 on each I/O pad 350 to provide low impedance power delivery and off-package I/O signaling. These 3D bond pads were protected by ESD circuits in the peripheral I/O pad logic. They were designed to provide wafer-probe test access to the design prior to 3D assembly. Accordingly, each 4×11 grid is associated with 44 back-side TSVs and 44×16=704 top-side vias.

In addition to the 1280 3D-interconnect bond pads and the 1200 edge-located interconnect bond pads mentioned above, we added 11968 peripheral I/O pads and 6336 peripheral power pads. In all, 41,568 3D bond pads were added to the 6M-3D design.

Figure 7:
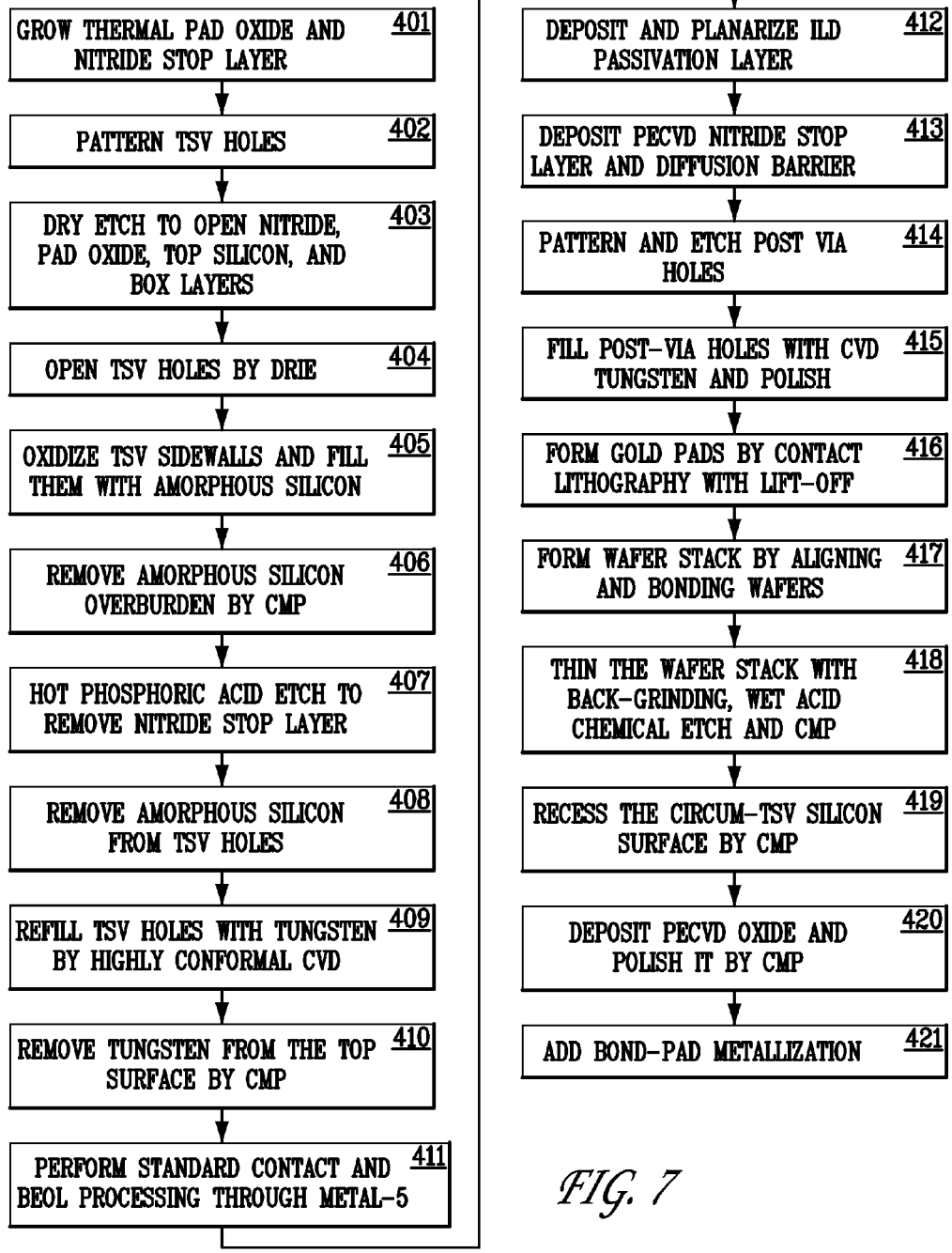
FIG. 7 provides a flowchart of an exemplary 24-mask, 5-layer metallization, CMOS process for making a 2D die in accordance with implementations of the present invention.

With reference to FIG. 7, we will now describe the 24-mask, 5-layer metallization, CMOS process that we used to make the 2D die. We began with a P-type SOI (270 nm top Si, 200 nm BOX) 150 mm wafer. In a departure from standard processes, we built front-end-of-flow (FEOL) TSVs into the wafers at the outset.

At the start of the process, Step 401, a 10-nm thermal pad oxide was grown and an 80-nm LPCVD nitride stop layer was deposited. Then, at Step 402, TSV holes were lithographically patterned on the nitride. Successive dry etches 403 were then performed to open the nitride, pad oxide, top silicon, and BOX layers.

Deep reactive ion etching (DRIE) 404 was then performed to make TSV holes. Typical TSV hole dimensions are diameter 2 μm, depth 20 μm. A 200-nm thermal oxidation 405 of the sidewalls was performed to uniformly insulate the TSV holes, and a 1.0-μm amorphous silicon (a-Si) layer was deposited by LPCVD to fill them. More specifically, the a-Si layer was slowly grown inward from the walls of the holes until the holes were filled.

Chemical-mechanical polishing (CMP) 406 was used to remove the amorphous silicon (a-Si) overburden. This was followed by a hot phosphoric acid etch 407 to remove the nitride stop layer. The a-Si in the TSV plugs was used as a placeholder through the entire course of the CMOS FEOL processing. The FEOL processing included shallow trench isolation, well formation, gate module formation, source and drain module formation, and such other CMOS processes as were necessary to form the transistors and other basic CMOS circuit elements. The a-Si was ultimately removed by using another round 408 of TSV mask patterning with a multi-step "3D contact" dry etch sequence, following pre-metal dielectric polishing by CMP.

Tungsten was then deposited by highly conformal CVD 409 to refill the TSV volumes, followed by conventional CMP 410 to remove tungsten from the top surface.

Standard contact and BEOL processing 411 continued from this point up through M5. At M5, an additional interlayer dielectric (ILD) passivation layer was deposited and planarized with CMP 412, and a 200-nm PECVD nitride stop layer and diffusion barrier was deposited 413.

Post-via lithography and etch 414 were used to create "post-via" holes, which were filled with tungsten deposited by CVD and polished 415, leaving a planar nitride top surface with embedded vias. Contact lithography with lift-off 416 was used to form 1-μm-thick gold (Au) pads.

A two-level wafer stack was then formed 417 by aligning a pair of the processed wafers and bonding them at 400 C with a force of 30 kN. The wafer stack was attached by Au—Au metallic bonding between the mating pads. Next, the wafer stack was thinned 418 using a combination of back-grinding, wet acid chemical etch, and CMP. The thinning step removed most of a single wafer thickness (roughly 655 μm net in the present example), thereby revealing the buried tungsten TSVs and their adjacent oxide insulator.

Further CMP 419 was used to recess the silicon surface surrounding the TSVs. A PECVD oxide for isolation was first deposited and then polished by CMP 420 to re-reveal the TSV tungsten.

At this point, bond-pad metallization 421, which is typically aluminum, can be added to complete the two-wafer stack. Alternatively, a new gold metallization can be added to enable an additional wafer to be stacked on by Au—Au bonding.

Although the preceding description is directed to wafer-to-wafer stacking, it should be noted that viable alternatives include die-to-die and die-to-wafer stacking. Similarly, the particular Au—Au bonding scheme described here is one of various alternatives known to those skilled in the art. It should also be noted in this regard that the use of SOI wafers as described above is exemplary and not limiting. For example, the techniques described above for forming the TSVs are also applicable to ordinary epi wafers.

The use of an a-Si placeholder and its replacement by tungsten in the FEOL TSV-fabrication process described above diverges from conventional CMOS techniques. Although conventional alternatives could be used, we believe that our approach is preferable. In place of a-Si, other similar polysilicon placeholders could be used, provided that the material is free of metal contamination and is compatible with high-temperature processing. Pertinent methods for TSV integration are described, e.g., in T. M. Bauer et al., "Front end of line integration of high density, electrically isolated, metallized through silicon vias," *IEEE Electronic Components and Technology Conference*, ECTC 2009 $59^{th}$ (26-29 May, 2009) 1165-1169.

What is claimed is:

1. An IC assembly, comprising:
  two or more structured ASIC dies that are vertically arranged and interconnected by hard-wired vertical vias to form a 3D stack and that are further interconnected by a 3D application-specific interconnection pattern, wherein:
  each of the dies includes a plurality of metallization layers;
  one adjacent pair of metallization layers in each of the dies is interconnected by a mask-programmed pattern of vias; and
  the mask-programmed via patterns of the respective dies collectively define all mask-programmable routing for the 3D application-specific interconnection pattern.

2. The assembly of claim 1, wherein adjacent dies are bonded together by front-side top-metal pads and by back-side bond pads that are connected to through-silicon vias (TSVs).

3. The assembly of claim 2, wherein each of the dies includes a regular structured array of top-side vias aligned with a regular back-side array of TSVs, and wherein each of the arrays is arranged symmetrically about at least one horizontal axis.

4. The assembly of claim 1, wherein at least some of the hard-wired vertical vias are through-silicon vias.

5. The assembly of claim 1, further comprising a top-side array of contact pads and a bottom-side array of contact pads, wherein each of the contact pads is connected to at least one hard-wired vertical via.

6. The assembly of claim 1, wherein each of the dies comprises:
  a silicon or silicon-on-insulator substrate having a back side;
  a vertical sequence of metallization layers that overlie the substrate and are interconnected by vias;
  an array of contact pads arranged on the back side and connected to the metallization layers by through-silicon vias; and
  an array of contact pads that are arranged on a top side of the die opposite the bottom side and are connected to the metallization layers by a pattern of vias.

7. The assembly of claim 6, wherein the top-side and bottom-side contact pads are arranged in mutual alignment such that each pad on one side is paired with a corresponding pad on the other side.

8. The assembly of claim 7, wherein:
  each die includes at least one master tile containing logic gates, memory, and metallization patterns for signal and power distribution;
  each master tile is adjacent to and connected with some of the paired top-side and bottom-side contact pads; and
  each die includes further pairs of top-side and bottom-side contact pads arranged in at least one array situated near an edge of the die.

9. The assembly of claim 8, further comprising a plurality of vias arranged peripherally on each of the dies, wherein said further vias are connected to corresponding front-side and back-side contact pads and are conformed for power delivery and ground connections.

10. The assembly of claim 9, further comprising a redundant arrangement of top-side bond pads for the vertical distribution of power and I/O signals.

11. The assembly of claim 9, wherein the assembly is subdivided into four separate power domain quadrants.

12. A method for making an IC assembly, comprising:
  forming two or more structured ASIC dies, wherein each of the dies includes a plurality of metallization layers and wherein one adjacent pair of metallization layers in each of the dies is interconnected by a mask-programmed pattern of vias; and
  vertically arranging the structured ASIC dies and interconnecting them by hard-wired vertical vias so as to form a 3D stack,
  wherein the forming step comprises programming the mask programmed via pattern in each of the dies so as to collectively define, over all of the programmed patterns, all mask-programmable routing for a 3D application-specific interconnection pattern in the stack.

13. The method of claim 12, wherein the forming step further comprises adding a top-side array of contact pads and a bottom-side array of contact pads to each of the structured ASIC dies and connecting each of the contact pads to at least one hard-wired vertical via.

14. The method of claim 12, wherein the forming step further comprises, for each of the structured ASIC dies:
  providing a silicon or silicon-on-insulator substrate having a back side;
  forming the metallization layers in a vertical sequence that overlies the substrate;
  interconnecting the metallization layers with vias;
  forming an array of contact pads arranged on the back side and connected to the metallization layers by through-silicon vias; and
  forming an array of contact pads that are arranged on a top side of the die opposite the bottom side and are connected to the metallization layers by a pattern of vias,
  wherein the top-side and bottom-side contact pads are arranged in mutual alignment such that each pad on one side is paired with a corresponding pad on the other side.

15. The method of claim 14, wherein the step of vertically arranging and interconnecting the structured ASIC dies comprises face-to-face stacking of dies and face-to-back stacking of dies.

16. The method of claim 12, wherein the step of vertically arranging and interconnecting the structured ASIC dies comprises wafer-to-wafer assembly.

17. The method of claim 12, wherein the step of vertically arranging and interconnecting the structured ASIC dies comprises die-to-wafer assembly.

18. The method of claim 12, wherein the step of vertically arranging and interconnecting the structured ASIC dies comprises die-to-die assembly.

* * * * *